(12) United States Patent
Rahbar-Dehghan

(10) Patent No.: US 6,879,010 B2
(45) Date of Patent: Apr. 12, 2005

(54) CERAMIC BIOMOLECULE IMAGING CHIP

(75) Inventor: Fariborz Rahbar-Dehghan, Edmonton (CA)

(73) Assignee: Royce Technologies LLC, Edmonton (CA)

( * ) Notice: Subject to any disclaimer, the term of this patent is extended or adjusted under 35 U.S.C. 154(b) by 190 days.

(21) Appl. No.: 10/263,052

(22) Filed: Oct. 1, 2002

(65) Prior Publication Data

US 2003/0111723 A1 Jun. 19, 2003

(51) Int. Cl.$^7$ ............................................... H01L 49/00
(52) U.S. Cl. .................... 257/414; 250/461.1; 356/434; 436/172
(58) Field of Search .................. 436/172; 356/434; 250/461.1; 257/414

(56) References Cited

U.S. PATENT DOCUMENTS 5,681,635 A * 10/1997 Nelson et al. ............. 428/65.3
6,312,906 B1 * 11/2001 Cass et al. ..................... 435/6

* cited by examiner

*Primary Examiner*—Jerome Jackson
(74) *Attorney, Agent, or Firm*—Hogan & Hartson, LLP

(57) ABSTRACT

A ceramic biomolecule imaging chip includes a ceramic body having a planar imaging surface. The planar imaging surface is highly polished within tolerances of plus or minus 1 microinch. This ceramic chip is compatible with fluorescence laser scanning devices. It is preferred that the ceramic body be 99.6% alumina oxide in order to also be compatible with non-fluorescent detection systems.

9 Claims, 1 Drawing Sheet

CERAMIC BIOMOLECULE IMAGING CHIP

FIELD OF THE INVENTION

The present invention relates to a ceramic biomolecule imaging chip

BACKGROUND OF THE INVENTION

In an article published in the May 2000 issue of ACTA Biochimica of Biophysica Sinica (Ma et al), scientists from the Institute of Molecular Biology in China discuss the potential of using ceramic chips.

The Ma et al article notes that ceramic has a chemistry similar to silicon. This enables the same surface chemistry used for DNA arraying on glass chips to be used for ceramic chips. Ceramic has a unique surface structure that allows more DNA to be arrayed. Because more DNA can be arrayed, ceramic chips can be used several times through probe stripping without significant sensitivity loss. In addition, ceramics are commonly used in semi-conductor and computer chip manufacturing. This enables unique electronic devices to be embedded in the chip to monitor and control DNA hybridization.

The work of the Chinese scientists prompted scientists in North America to experiment with ceramic chips. There is wide range of advanced ceramic materials. It can be divided into non-oxide and oxide ceramics. The family of non-oxide includes; alumina, alumina nitride, silicon carbide, silicon nitride. The oxide family includes alumina, zirconia and sapphire. Alumina is the most widely used advanced ceramic materials with good corrosion resistance at reasonable price. 99.6% aluminum oxide substrate, which is commonly referred to as "thin film ceramic substrate, has a surface finish of 8 to 12 microinches after lapping and polishing. 96% aluminum oxide substrate, which is commonly referred to as "thick film ceramic substrate", has similar thickness and flatness characteristics but a surface finish of 15 to 20 microinches after lapping and polishing.

It was discovered that surface irregularities on the ceramic chips were incompatible with fluorescence laser scanning devices used to scan the surface of the substrate. For example, the laser scanner sold under the Trade Mark "ChipReader" manufactured by Virtek Vision of Hamilton, Ontario, Canada. Although macromolecules adhere to the surface of the ceramic chips, fluorescent compound becomes trapped in grooves and defects. This requires harsher washing conditions than normal, resulting in detachment of desired molecules from the surface of the substrate. This does not provide the sensitivity necessary to accurately read arrays of DNA and macromolecules, such as proteins and antibodies.

SUMMARY OF THE INVENTION

What is required is a ceramic biomolecule imaging chip which can overcome the short comings presently being experienced with ceramic chips.

According to the present invention there is provided a ceramic biomolecule imaging chip which includes a ceramic body having a planar imaging surface. The planar imaging surface is polished within tolerances of plus or minus 1 microinch.

The ceramic biomolecule imaging chip, as described above, has been found to be compatible with fluorescence laser scanning devices. It is superior to glass chips. Glass chips are transparent. Impurities in the glass provide an undesirable background that can distort results obtained when examining the glass chips with photo-sensitive devices. In contrast, ceramic chips are opaque and, as such, less prone to distort results; provided that they are polished within the above described tolerances.

Although beneficial results may be obtained through the use of the ceramic biomolecule imaging chip, as described above, even more beneficial results may be obtained when the ceramic body is capable of withstanding temperatures of in excess of 1000 degrees celsius without having any change in physical properties of the body. Organic matter disintegrates at around 1000 degree celsius. If all traces of organic material could be removed it would enable the biomolecule imaging chips to be reused. Glass chips can only withstand temperatures of 400 degrees celsius and, therefore, cannot be reused. In contrast, by selecting appropriate materials, ceramic chips can be fabricated that are able to withstand the temperature above 1000 celsius without having any changes in their physical properties. Ceramic materials not only endure higher temperature, they have greater chemical resistance. This makes it possible to recycle ceramic chips by using a combination of high temperature and harsh chemicals in order to remove organic matter.

Although beneficial results may be obtained through the use of the ceramic biomolecule imaging chip, as defined above, in order to have a chip which is also compatible with non-fluorescent detection system it is preferred that the ceramic body be of 99.6% alumina oxide. In non-fluorescent detection systems where the colour is indication of the end result, the ivory and white colour associated with alumina oxide makes it ideal for these reactions.

BRIEF DESCRIPTION OF THE DRAWINGS

These and other features of the invention will become more apparent from the following description in which reference is made to the appended drawings, the drawings are for the purpose of illustration only and are not intended to in any way limit the scope of the invention to the particular embodiment or embodiments shown, wherein.

DETAILED DESCRIPTION OF THE PREFERRED EMBODIMENT

Figure 1:
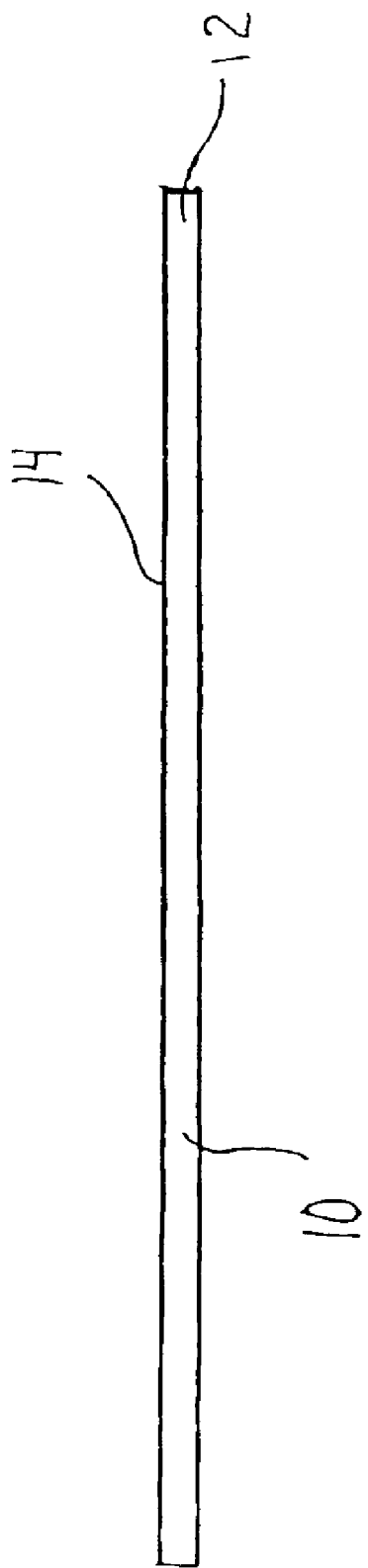
FIG. 1 is a microscopically enlarged side elevation view of a ceramic biomolecule imaging chip fabricated in accordance with the teachings of the present invention.

The preferred embodiment, a ceramic biomolecule imaging chip generally identified by reference numeral 10, will now be described with reference to FIG. 1.

Ceramic chip 10 has a ceramic body 12 with a planar imaging surface 14. Planar imaging surface 14 is polished within tolerances of plus or minus 1 microinch.

We have determined that in order to have a ceramic chip that is compatible with testing methodologies using commercially available scanners, the ceramic material must be lapped and polished to a tolerance of 1 microinch. Zirconia was found to have the highest strength and toughness at room temperature and fine grain size. Zirconia could be polished to make the surface defect-free to a tolerance of 0.5 microinch. The use of aluminum oxide ceramic, however, is preferred due to lesser costs associated with this substrate and colour compatibility, as will hereinafter further described.

It is preferred that the ceramic materials selected for ceramic body 12 be capable of withstanding temperatures of in excess of 1000 degrees celsius without changing their physical properties. Organic matter disintegrates at around 1000 degree celsius. Removing all traces of organic material enables ceramic chip 10 to be reused.

Different ceramic materials have different colours. Silicon carbide is black. Silicon nitride has a black and grey colour to it. Sapphire is transparent. Alumina oxide is white and ivory. In non-fluorescent detection system where the colour is indication of the end result, the use of aluminum oxide is preferred. This is mainly due to the fact that the ivory and white colour associated with this substrate makes it ideal for these reactions. Many of current enzymatic and substrate reactions are based on use of nylon and filter membranes with an ivory or white background. Therefore, the colour of aluminum oxide substrate makes it compatible with blue or red or brown precipitation of enzyme amplification reaction for detection purposes. One good example is the attachment of red blood cells to the antibodies arrayed on the surface of this substrate. The positive reaction may be signalled by the presence of the red spot on the white background easily distinguished. Therefore, the advantages of white colour associated with alumina oxide ceramic in non-fluorescent testing where the background colour makes it important in distinguishing the positive from negative test.

EXAMPLE

In our testing a series of 99.6% alumina oxide ceramic chips were polished surface to a tolerance of one microinch or better. The length was 3 inches by 1 inch and the thickness of 0.040 of inch or 1 millimetre. This was the same dimension as microscope glass slide and, therefore, also served to conveniently replace many of the tests that were done on microscope glass (where transparency is not a requirement). One of the tests was arraying DNA on the surface. Since the composition of ceramic material has similarity to glass slides, the chemistry of the attachment of macromolecules to the surface of the ceramic was the same as to glass. The macromolecules used were protein, antibody, DNA, cell particles. It will be appreciated that any other small molecules could also be used. On non-fluorescent calorimetric reaction testing, the ivory and white background provided by the alumina oxide, enabled the tests to clearly show. When the tests were completed, the ceramic chip was heat treated at temperatures in excess of 1000 degrees celsius to destroy all organic matter and then was reused.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

It will be apparent to one skilled in the art that modifications may be made to the illustrated embodiment without departing from the spirit and scope of the invention as hereinafter defined in the Claims:

The embodiments of the invention in which an exclusive property or privilege is claimed are defined as follows:

1. A ceramic biomolecule imaging chip, comprising:
   a ceramic body having a planar imaging surface, the planar imaging surface being polished within tolerances of plus or minus 1 microinch; and
   a biomolecule associated with the surface.

2. The ceramic biomolecule imaging chip as defined in claim 1, wherein the ceramic body is capable of withstanding temperatures of in excess of 1000 degrees celsius without having any change in physical properties of the body.

3. The ceramic biomolecule imaging chip as defined in claim 1, wherein the ceramic body is 99.6% alumina oxide.

4. The ceramic biomolecule imaging chip of claim 1, wherein the biomolecule is a macromolecule or a small molecule.

5. The ceramic biomolecule imaging chip of claim 4, wherein the macromolecule is a nucleic acid, a protein, an antibody, or a part of a cell particle.

6. The ceramic biomolecule imaging chip of claim 2, wherein the biomolecule is a macromolecule or a small molecule.

7. The ceramic biomolecule imaging chip of claim 6, wherein the macromolecule is a nucleic acid, a protein, an antibody, or a part of a cell particle.

8. The ceramic biomolecule imaging chip of claim 3, wherein the biomolecule is a macromolecule or a small molecule.

9. The ceramic biomolecule imaging chip of claim 8, wherein the macromolecule is a nucleic acid, a protein, an antibody, or a part of a cell particle.

\* \* \* \* \*